(12) United States Patent
Cruz et al.

(10) Patent No.: US 6,437,653 B1
(45) Date of Patent: Aug. 20, 2002

(54) METHOD AND APPARATUS FOR PROVIDING A VARIABLE INDUCTOR ON A SEMICONDUCTOR CHIP

(75) Inventors: Jose M. Cruz, Palo Alto; Bodo K. Parady, Danville, both of CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/675,115

(22) Filed: Sep. 28, 2000

(51) Int. Cl.[7] .............................. H03B 5/12; H01L 29/00
(52) U.S. Cl. ................. 331/181; 331/36 L; 331/117 R; 331/117 D; 331/177 R; 331/96; 257/531
(58) Field of Search ................................ 331/36 L, 96, 331/99, 115, 117 R, 117 FE, 117 P, 132, 177 R; 257/528, 531

(56) References Cited

U.S. PATENT DOCUMENTS 5,095,357 A * 3/1992 Andoh et al. .................. 357/51
6,016,082 A    1/2000 Cruz et al. .................... 331/117

OTHER PUBLICATIONS

"Low Voltage Design Techniques and Considerations for Integrated Operational Amplifier Circuits", by Gabriel Alfonso Rincon M., Georgia Institute of Technology, School of Electrical and Computer Engineering, May 31, 1995; 26 pages.

* cited by examiner

Primary Examiner—David Mis
(74) Attorney, Agent, or Firm—Park, Vaughan & Fleming LLP

(57) ABSTRACT

One embodiment of the present invention provides an inductor with a variable inductance within a semiconductor chip. This inductor includes a primary spiral composed of a conductive material embedded within the semiconductor chip to provide a source of variable inductance. It also includes a control spiral composed of the conductive material vertically displaced from the primary spiral in neighboring layers of the semiconductor chip. This control spiral is magnetically coupled with the primary spiral so that changing a control current through the control spiral induces a change in inductance through the primary spiral. The inductor also includes a controllable current source coupled to the control spiral that is configured to provide the control current. One embodiment of the present invention includes a core surrounding the primary spiral and the control spiral in the semiconductor chip. This core is comprised of a core material with a magnetic permeability that facilitates magnetically coupling the control spiral with the primary spiral. In a variation on this embodiment, the core material includes a high frequency ferrite that operates at a frequency above one gigahertz without resistive eddy losses that substantially prevent a magnetic coupling between the control spiral and the primary spiral. In a variation on this embodiment, the high frequency ferrite can include NiZn.

25 Claims, 6 Drawing Sheets

METHOD AND APPARATUS FOR PROVIDING A VARIABLE INDUCTOR ON A SEMICONDUCTOR CHIP

BACKGROUND

1. Field of the Invention

The present invention relates to circuit elements within semiconductor chips. More specifically, the present invention relates to a method and an apparatus for providing a voltage-controlled variable inductor within a semiconductor chip.

2. Related Art

As microprocessor clock speeds continue to increase at an exponential rate, it is becoming progressively harder to generate clock signals accurately enough to synchronize the various components within a microprocessor. Microprocessors presently make use of on-chip clock generation circuitry, which is synchronized with an off-chip oscillator, in order to generate a clock signal that gets distributed throughout a clocking network to the various components of the microprocessor. This on-chip clock generation circuitry is typically implemented using a ring oscillator comprised of an odd number of inverters linked together into a ring.

However, as microprocessor clock speeds continue to increase, the effects of noise in the power supply lines feeding into the ring oscillator introduce a significant amount of "jitter" into the resulting clock signal. This jitter gives rise to variations in the frequency of the clock signal that is delivered to different components within the microprocessor, and can thereby cause synchronization problems within the microprocessor chip.

The susceptibility of the clock signal to power supply noise can be reduced by replacing the ring oscillator with another type of clock generation circuit, such as an LC oscillator that is comprised of an inductor and a capacitor. Note that the frequency of an LC oscillator depends upon the inductance and capacitance of circuit elements that comprise the LC oscillator. Hence, an LC oscillator is relatively immune to fluctuations in power supply voltage.

However, providing an inductor on a semiconductor chip has so far not been practical due to large resistances through the metal traces that make up an inductor within a semiconductor chip. Fortunately, these large resistances tend to be less significant in comparison to the total impedance of the inductor at the higher frequencies at which on-chip clock generation circuits are beginning to operate. Furthermore, the use of copper instead of aluminum further reduces the resistance through the metal traces that make up an on-chip inductor.

Furthermore, clock generation circuits typically require some type of mechanism to adjust the frequency of the signal produced by the clock generation circuit. For an off-chip LC oscillator, this can be accomplished by adjusting the inductance of the LC circuit. However, there presently exists no mechanism for adjusting the inductance of an on-chip inductor.

What is needed is a method and an apparatus for adjusting the inductance of an on-chip inductor.

SUMMARY

One embodiment of the present invention provides an inductor with a variable inductance within a semiconductor chip. This inductor includes a primary spiral composed of a conductive material embedded within the semiconductor chip to provide a source of variable inductance. It also includes a control spiral composed of the conductive material vertically displaced from the primary spiral in neighboring layers of the semiconductor chip. This control spiral is magnetically coupled with the primary spiral so that changing a control current through the control spiral induces a change in inductance through the primary spiral. The inductor also includes a controllable current source coupled to the control spiral that is configured to provide the control current.

One embodiment of the present invention includes a core surrounding the primary spiral and the control spiral in the semiconductor chip. This core is comprised of a core material with a magnetic permeability that facilitates magnetically coupling the control spiral with the primary spiral. In a variation on this embodiment, the core material includes a high frequency ferrite that operates at a frequency above one gigahertz without resistive eddy losses that substantially prevent a magnetic coupling between the control spiral and the primary spiral. In a variation on this embodiment, the high frequency ferrite can include NiZn.

In one embodiment of the present invention, the conductive material that makes up the primary spiral and the control spiral can include aluminum or copper.

In one embodiment of the present invention, the primary spiral includes a plurality of spirals composed of the conductive material that are vertically displaced from each other on different layers of the semiconductor chip, wherein the plurality of spirals are linked together through vertical conductors between the different layers of the semiconductor chip.

In one embodiment of the present invention, the primary spiral is in the form of a helix, wherein successive turns of the helix are vertically displaced from each other in different layers of the semiconductor chip.

In one embodiment of the present invention, successive turns of the primary spiral occupy the same layer of the semiconductor chip, but are radially displaced from prior turns of the primary spiral.

In one embodiment of the present invention, the controllable current source is configured to provide an alternating current at a frequency greater than one gigahertz with a controllable amplitude.

In one embodiment of the present invention, the controllable current source is configured to provide a direct current.

In one embodiment of the present invention, the controllable current source includes a control input for receiving a control voltage, wherein the control current produced by the controllable current source is proportionate to the control voltage.

One embodiment of the present invention provides an oscillator circuit within a semiconductor chip. This oscillator circuit includes an oscillator output with a first terminal and a second terminal. A number of circuit elements are coupled between the first terminal and the second terminal, including a capacitor, a negative resistance source, and a voltage-controlled inductor. This voltage-controlled inductor includes a primary spiral composed of a conductive material embedded within the semiconductor chip to provide a source of variable inductance, as well as a control spiral composed of the conductive material vertically displaced from the primary spiral in neighboring layers of the semiconductor chip. This control spiral is magnetically coupled with the primary spiral so that changing a control current through the control spiral induces a change in inductance through the primary spiral. The voltage-controlled inductor also includes a controllable current source coupled to the control spiral that is configured to provide the control current.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Semiconductor Chip

Figure 1:
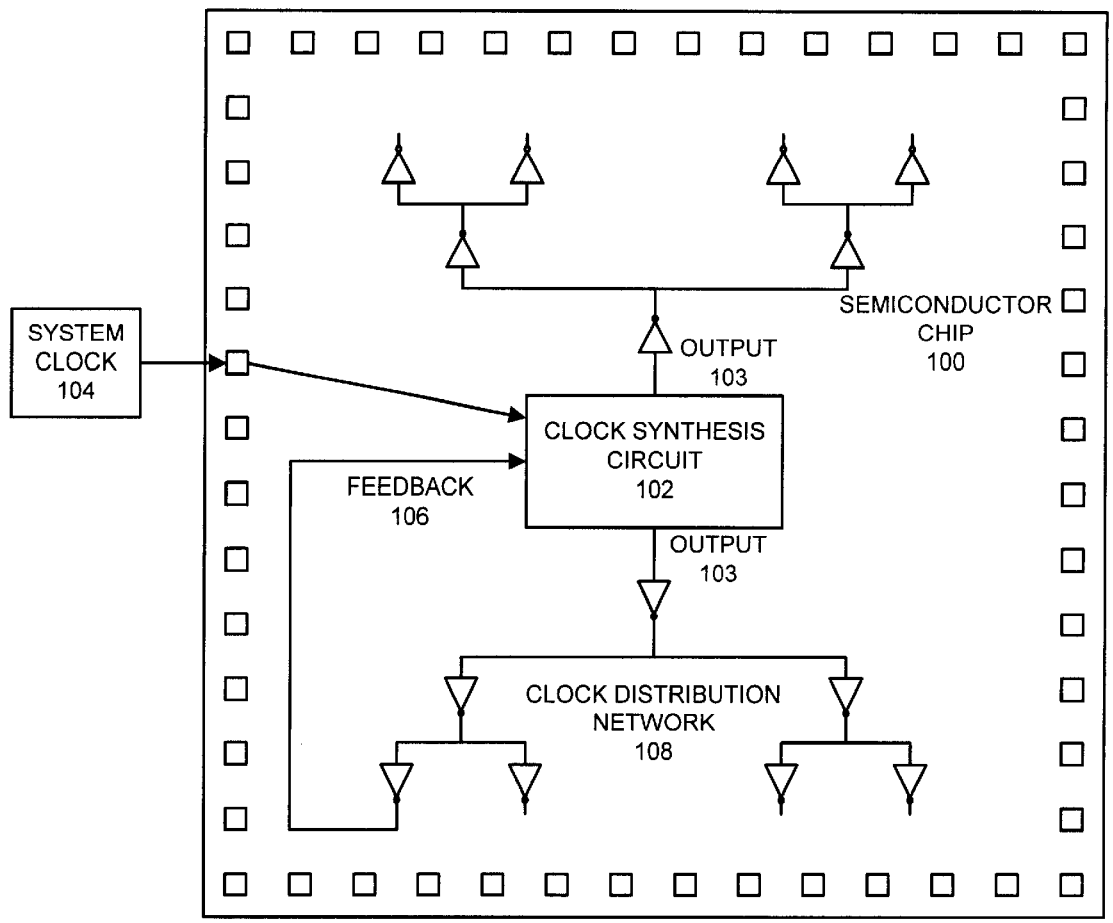
FIG. 1 illustrates a semiconductor chip including a clock synthesis circuit in accordance with an embodiment of the present invention.

FIG. 1 illustrates a semiconductor chip 100 including a clock synthesis circuit 102 in accordance with an embodiment of the present invention. Semiconductor chip 100 can generally include any type of semiconductor chip that requires an on chip clock signal. For example, semiconductor chip 100 can include a microprocessor chip, or a semiconductor chip that contains sequential logic. Semiconductor chip 100 can also includes any combination of semiconductor chips, for example in a multi-chip module.

Clock synthesis circuit 102 can generally include any type of circuit that uses a variable inductor to produce an output clock signal 103. Note that clock synthesis circuit 102 receives a system clock signal 104 from an external source outside of semiconductor chip 100. Clock synthesis circuit 102 uses this external system clock signal 104 as a reference signal in producing a higher frequency output clock signal 103. For example, if system clock signal 104 has a frequency of 100 megahertz, output clock signal 103 can have a frequency of 2 gigahertz.

The output 103 of clock synthesis circuit 102 feeds through clock distribution network 108, which propagates output 103 to components within semiconductor chip 100 that require synchronization. One of the signal lines within clock distribution network 100 becomes a feedback signal 106, which feeds back into clock synthesis circuit 102, and is used to make adjustments to the frequency of clock synthesis circuit 102 as is described below with reference to FIG. 2.

Note that although the present invention is described in the context of a clock synthesis circuit within a semiconductor chip 100, the present invention can generally be applied in any system can make use of an on-chip inductor with a variable inductance. For example, the on-chip variable inductor of the present invention can also be used in a low-noise amplifier within a semiconductor chip. Hence, the present invention is not meant to be limited to an on-chip clock generation circuit.

Clock Synthesis Circuit

Figure 2:
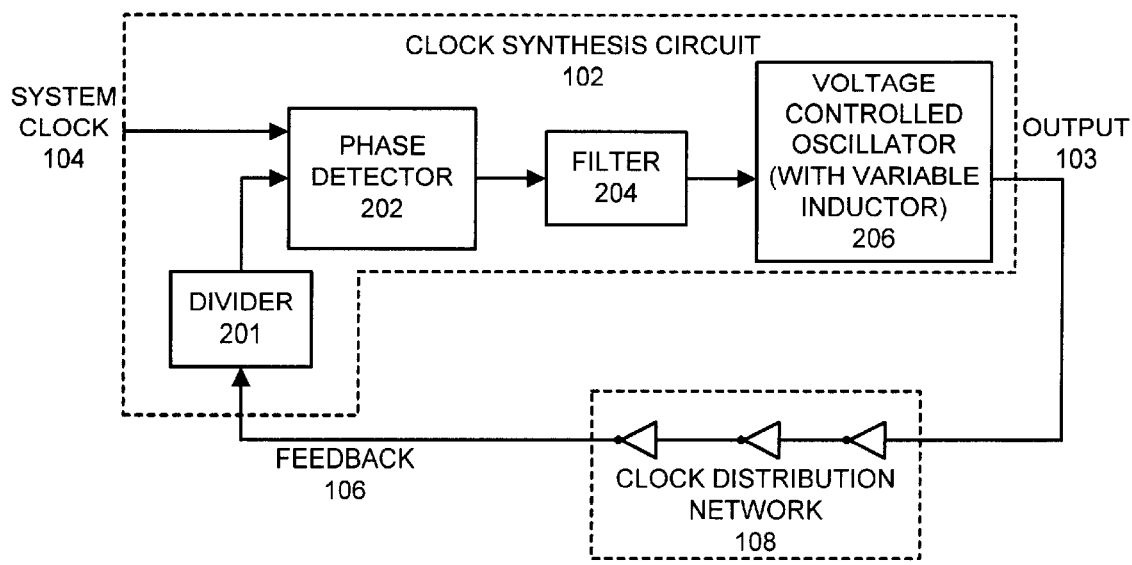
FIG. 2 illustrates a clock synthesis circuit in accordance with an embodiment of the present invention.

FIG. 2 illustrates clock synthesis circuit 102 from FIG. 1 in accordance with an embodiment of the present invention. As is illustrated in FIG. 1, clock synthesis circuit 102 receives system clock signal 104 as an input, and produces output clock signal 103. Output clock signal 103 feeds through clock distribution network 108 and produces feedback signal 106, which feeds into another input of clock synthesis circuit 102.

Clock synthesis circuit 102 is comprised of a number of sub-circuits, including divider circuit 201, phase detector circuit 202, filter 204 and voltage-controlled oscillator (VCO) 206.

Divider circuit 201 receives feedback signal 106 as an input, and divides the frequency of feedback signal 106 by an integer value to produce an output signal that feeds into phase detector circuit 202. This integer value specifies a multiplicative relationship between system clock signal 104 and output clock signal 103. For example, if system clock signal 104 has a frequency of 100 megahertz, and divider circuit 201 divides by the integer 20, output clock signal 103 has a frequency of 20×100 megahertz=2 gigahertz. Note that divider circuit 201 may be programmable to use different integer divisor values.

Phase detector circuit 202 compares the output of divider circuit 201 against system clock signal 104 and produces a voltage that feeds through filter 204 into VCO 206. This voltage varies as a function of a difference in phase between system clock signal 104 and the output of divider circuit 201.

Filter 204 includes a low pass filter to filter out high frequency components from the output of phase detector circuit 202.

VCO 206 uses the output of filter 204 to control the frequency of output clock signal 103. Note VCO 206 includes an on-chip variable inductor as is described in more detail below with reference to FIG. 3.

Also note that system clock signal 104 and feedback signal 106 are used to control the frequency of output clock signal 103 through a classic phase-locked loop arrangement.

Voltage-Controlled Oscillator

Figure 3:
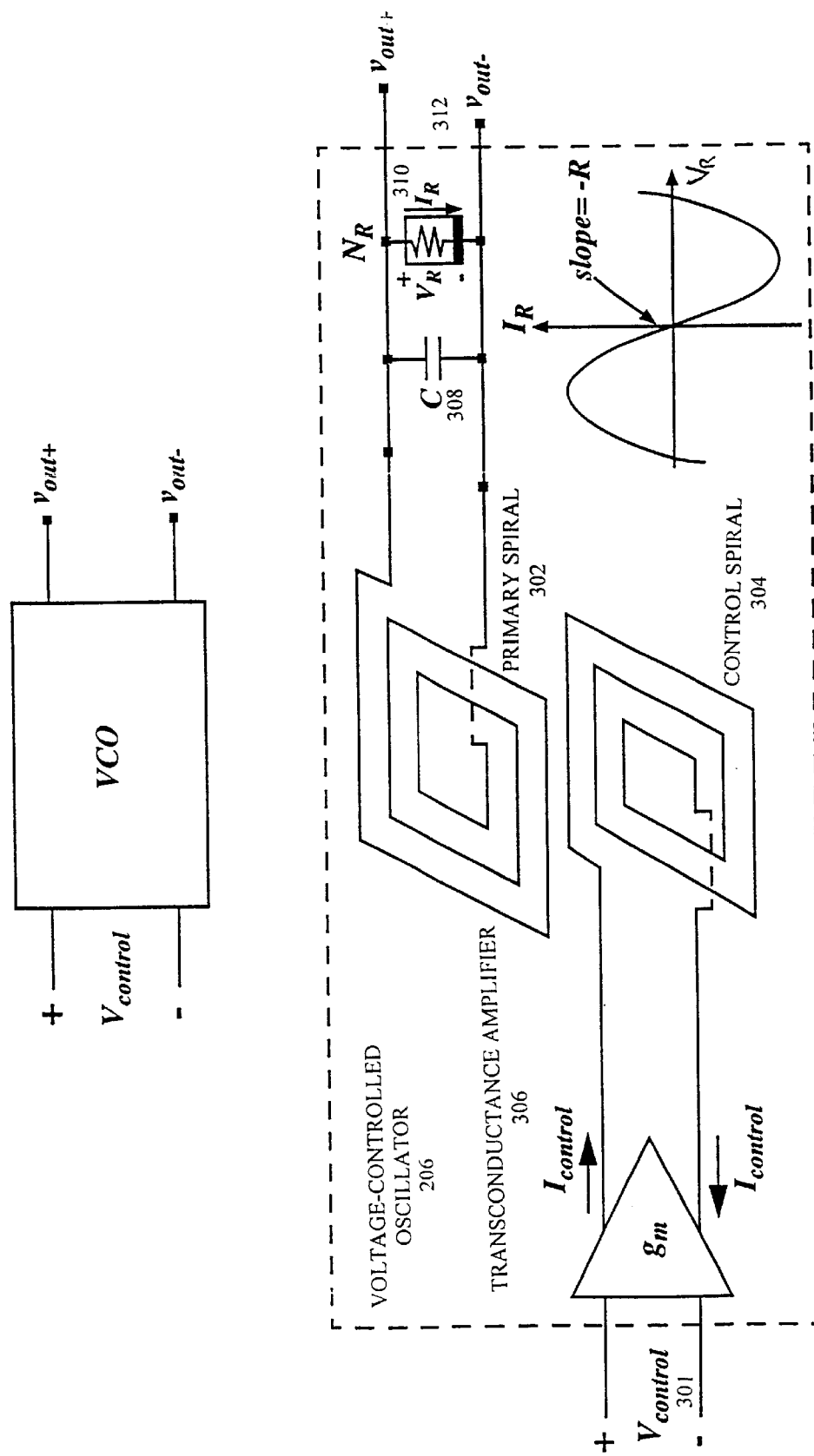
FIG. 3 illustrates a voltage-controlled oscillator (VCO) within the clock synthesis circuit of FIG. 2 in accordance with an embodiment of the present invention.

FIG. 3 illustrates the structure of voltage-controlled oscillator (VCO) 206 within clock synthesis circuit 102 of FIG. 2 in accordance with an embodiment of the present invention. VCO 206 receives a control output 301 from filter 204 in FIG. 2. VCO 206 produces an output voltage 312, which feeds into output clock signal 103 in FIG. 2.

VCO 206 includes transconductance amplifier 306, control spiral 304, primary spiral 302, capacitor 308 and negative resistor 310. Transconductance amplifier 306 is a well-known circuit element that converts an input voltage 301 into a proportionate control current that feeds through control spiral 304.

Control spiral 304 is magnetically coupled to primary spiral 302 so that a change in the control current through control spiral 304 induces a change in inductance through primary spiral 302.

Hence, a change in the input voltage 301 that is applied to transconductance amplifier 306 causes a change in the control current through control spiral 304, which results in a change in inductance through primary spiral 302.

In one embodiment of the present invention, transconductance amplifier 306 applies an alternating sinusoidal current through control spiral 304 in order to induce a change in inductance through primary spiral 302. In another embodiment of the present invention, transconductance amplifier 306 applies a constant direct current through control spiral 304 in order to induce the change in inductance through primary spiral 302.

Primary spiral 302 is coupled in parallel with both capacitor 308 and negative resistor 310 to produce an LC oscillator, which produces an oscillating output voltage 312. Note that negative resistor 310 is an active circuit element that compensates for resistance through primary spiral 302. A representative value for the capacitance of capacitor 308 is 1 pF, and a representative value for the inductance through primary spiral 302 is 5 nH.

Figure 4:
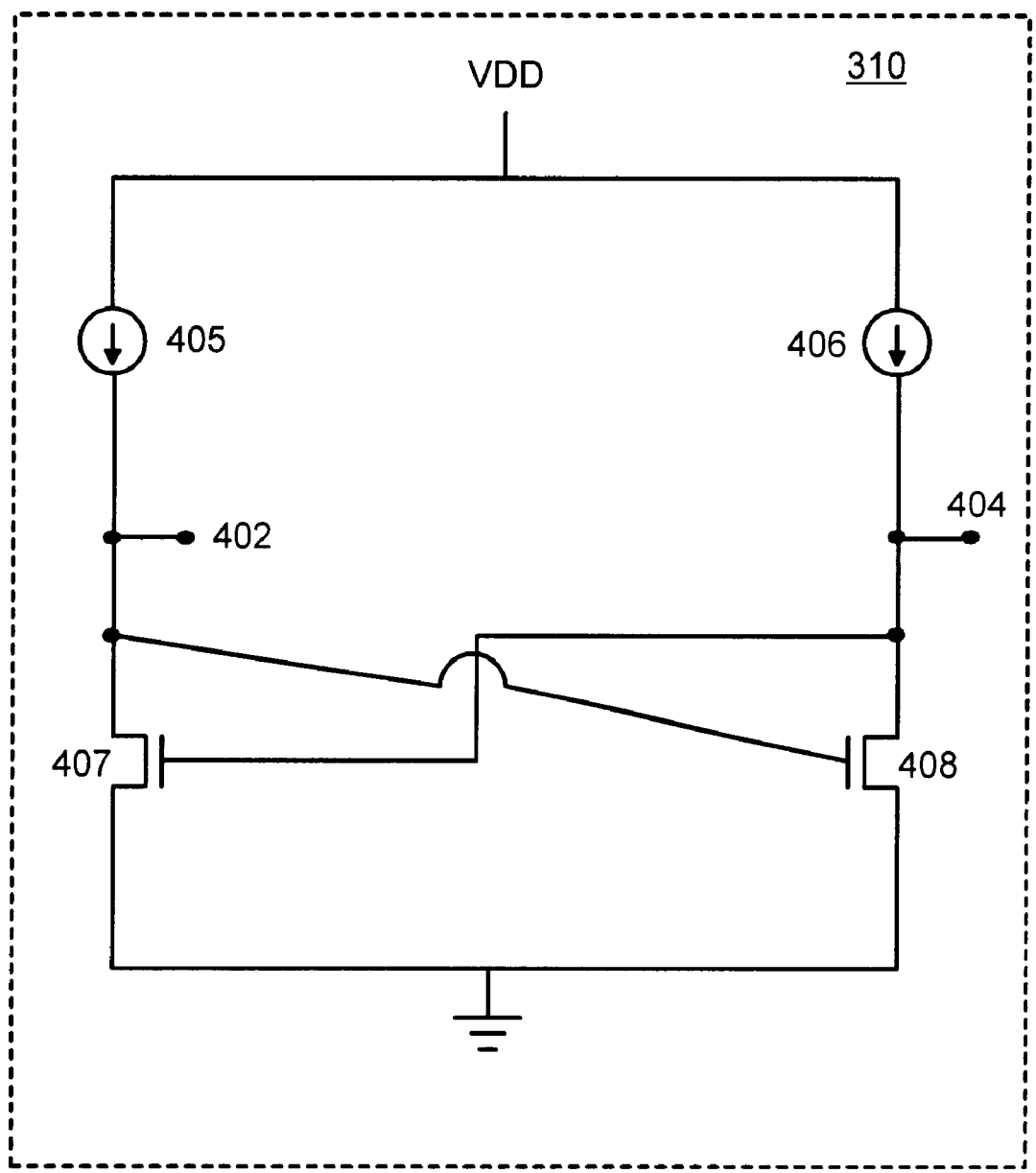
FIG. 4 illustrates an active source of negative resistance in accordance with an embodiment of the present invention.

FIG. 4 illustrates one possible structure for negative resistor 310 in accordance with an embodiment of the present invention. Negative resistor 310 has two output terminals 402 and 404.

Output terminal 402 is coupled between current source 405 and the drain of transistor 407. The other side of current source 405 is coupled to $V_{DD}$, and the source of transistor 407 is coupled to ground.

Output terminal 404 is coupled between current source 406 and the drain of transistor 408. The other side of current source 406 is coupled to $V_{DD}$, and the source of transistor 408 is coupled to ground.

Note that transistors 407 and 408 are cross-coupled so that the drain of transistor 407 is coupled to the gate of transistor 408 and the drain of transistor 408 is coupled to the gate of transistor 407.

The circuit illustrated in FIG. 4 provides a negative resistance between output terminals 402 and 404 for low amplitude voltages.

Physical Layout of On-Chip Variable Inductor

Figure 5:
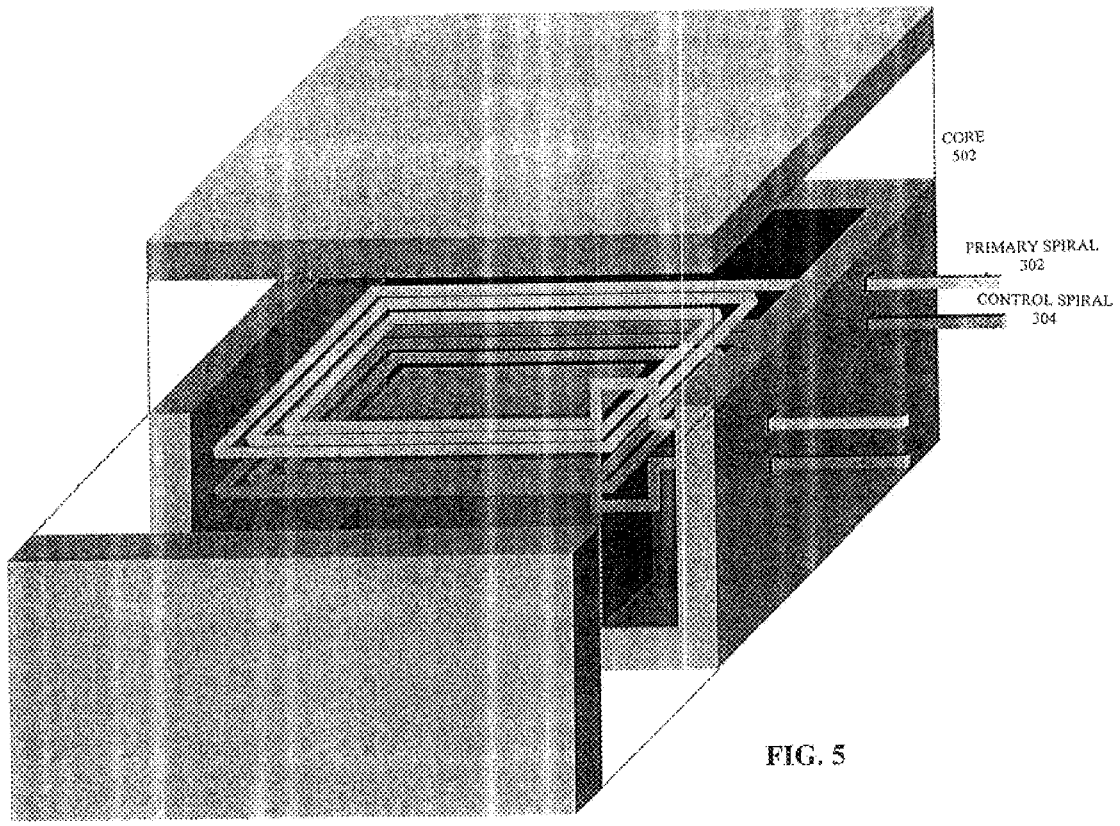
FIG. 5 illustrates the physical layout of a variable on-chip inductor in accordance with an embodiment of the present invention.

FIG. 5 illustrates the physical layout of a variable on-chip inductor in accordance with an embodiment of the present invention. The diagram in FIG. 5 illustrates how control spiral 304 is vertically displaced from primary spiral 302 in neighboring layers of semiconductor chip 100.

Primary spiral 302 and control spiral 304 are additionally encased within a core 502 that surrounds primary spiral 302 and control spiral 304. Note that core 502 is composed of a core material with a magnetic permeability that facilitates a magnetic coupling between control spiral 304 and primary spiral 302. This core material can include a high frequency ferrite that operates at a frequency greater than one gigahertz without resistive eddy losses that substantially prevent a magnetic coupling between control spiral 304 and primary spiral 302. In one embodiment of the present invention, this core material includes NiZn. Note that this core material can be deposited on semiconductor chip 100 using a number of techniques, such as organo-metallic molecular beam epitaxy or laser ablation.

Figure 6:
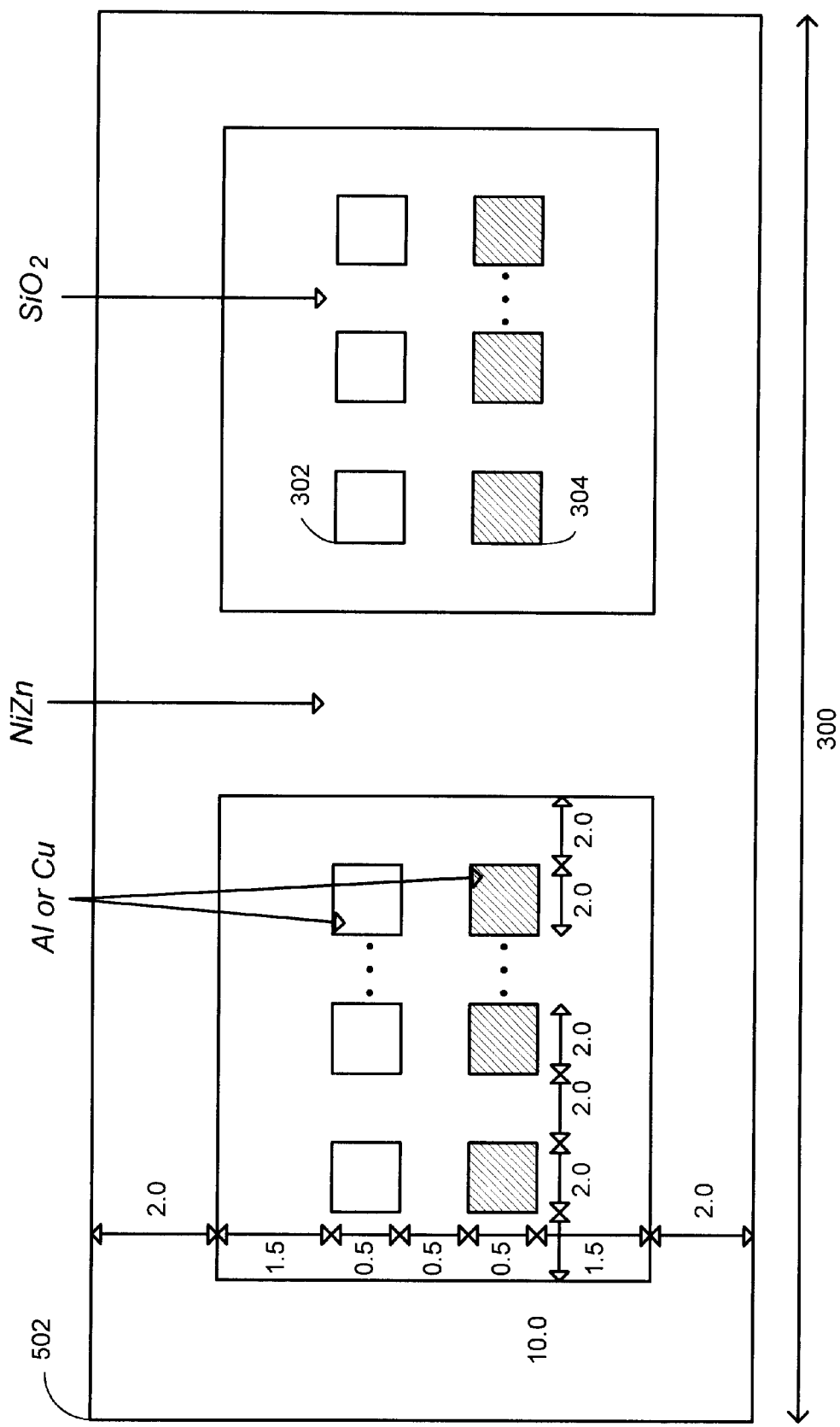
FIG. 6 illustrates a cross-section of the physical layout of the variable on-chip variable inductor of FIG. 5 in accordance with an embodiment of the present invention.

FIG. 6 illustrates a cross-section of the physical layout of the variable on-chip variable inductor of FIG. 5 in accordance with an embodiment of the present invention. Note that primary spiral 302 and control spiral 304 are encased within $SiO_2$ regions that are further encased within a NiZn core 502. Also note that control spiral 304 and primary spiral 302 can include aluminum or copper traces.

As illustrated in FIGS. 5 and 6, control spiral 304 and primary spiral 302 can both include three spiral turns, although smaller and larger numbers of turns can be used.

In order to reduce the resistance through primary spiral 302, primary spiral 302 can be replaced with a plurality of spirals that are stacked on top of each other in neighboring layers of semiconductor chip 100. These stacked spirals can then be interconnected through vertical vias through semiconductor chip 100. The same can be done for control spiral 304.

Alternatively, primary spiral 302 can be replaced by a helix, wherein successive turns of the helix are vertically displaced from preceding turns of the helix, but occupy the same planar location as preceding turns of the helix. This prevents the radial diameter of the helix for increasing for successive turns, as is the case for a normal planar spiral. This reduces wire length and can hence reduce resistance. The same can also be done for control spiral 304.

Note that the variable inductor of the present invention can be used to replace voltage controlled resistance elements in circuits. It can also be used as a pullup or a pulldown resistor where resistance is several K Ohms in applications where high frequency signals are handled. Here the NiZn inductor could have the advantage of being low noise—much lower than a resistor—and consume less power. Application would depend upon expected pull/up/down times and power requirements.

The foregoing descriptions of embodiments of the invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus for providing a variable inductance within a semiconductor chip, comprising:
   a primary spiral composed of a conductive material embedded within the semiconductor chip to provide a source of variable inductance;
   a control spiral composed of the conductive material vertically displaced from the primary spiral in neighboring layers of the semiconductor chip;
   wherein the control spiral is magnetically coupled with the primary spiral so that changing a control current through the control spiral induces a change in inductance through the primary spiral;
   a core surrounding the primary spiral and the control spiral in the semiconductor chip;
   wherein the core is comprised of a core material with a magnetic permeability that facilitates magnetically coupling the control spiral with the primary spiral; and
   a controllable current source coupled to the control spiral that is configured to provide the control current.

2. The apparatus of claim 1, wherein the core material includes a high frequency ferrite that operates at a frequency above one gigahertz without resistive eddy losses that substantially prevent a magnetic coupling between the control spiral and the primary spiral.

3. The apparatus of claim 2, wherein the high frequency ferrite includes NiZn.

4. The apparatus of claim 1, wherein the conductive material that makes up the primary spiral and the control spiral includes at least one of aluminum and copper.

5. The apparatus of claim 1,
   wherein the primary spiral includes a plurality of spirals composed of the conductive material that are vertically displaced from each other on different layers of the semiconductor chip, and
   wherein the plurality of spirals are linked together through vertical conductors between the different layers of the semiconductor chip.

6. The apparatus of claim 1, wherein the primary spiral is in the form of a helix, wherein successive turns of the helix are vertically displaced from each other in different layers of the semiconductor chip.

7. The apparatus of claim 1, wherein successive turns of the primary spiral occupy the same layer of the semiconductor chip, but are radially displaced from prior turns of the primary spiral.

8. The apparatus of claim 1, wherein the controllable current source is configured to provide an alternating current at a frequency greater than one gigahertz with a controllable amplitude.

9. The apparatus of claim 1, wherein the controllable current source is configured to provide a direct current.

10. The apparatus of claim 1,
wherein the controllable current source includes a control input for receiving a control voltage, and
wherein the control current produced by the controllable current source is proportionate to the control voltage.

11. An oscillator circuit within a semiconductor chip comprising:
an oscillator output including a first terminal and a second terminal;
a capacitor coupled between the first terminal and the second terminal;
a negative resistance source coupled between the first terminal and the second terminal;
a voltage-controlled inductor coupled between the first terminal and the second terminal, including,
a primary spiral composed of a conductive material embedded within the semiconductor chip to provide a source of variable inductance, wherein the primary spiral is coupled between the first terminal and the second terminal,
a control spiral composed of the conductive material vertically displaced from the primary spiral in neighboring layers of the semiconductor chip,
wherein the control spiral is magnetically coupled with the primary spiral so that changing a control current through the control spiral induces a change in inductance through the primary spiral, and
a controllable current source coupled to the control spiral that is configured to provide the control current.

12. The oscillator circuit of claim 11, further comprising a core surrounding the primary spiral and the control spiral in the semiconductor chip;
wherein the core is comprised of a core material with a magnetic permeability that facilitates magnetically coupling the control spiral with the primary spiral.

13. The oscillator circuit of claim 12, wherein the core material includes a high frequency ferrite that operates at a frequency above one gigahertz without resistive eddy losses that substantially prevent a magnetic coupling between the control spiral and the primary spiral.

14. The oscillator circuit of claim 13, wherein the high frequency ferrite includes NiZn.

15. The oscillator circuit of claim 11, wherein the conductive material that makes up the primary spiral and the control spiral includes at least one of aluminum and copper.

16. The oscillator circuit of claim 11,
wherein the primary spiral includes a plurality of spirals composed of the conductive material that are vertically displaced from each other on different layers of the semiconductor chip, and
wherein the plurality of spirals are linked together through vertical conductors between the different layers of the semiconductor chip.

17. The oscillator circuit of claim 11, wherein the primary spiral is in the form of a helix, wherein successive turns of the helix are vertically displaced from each other in different layers of the semiconductor chip.

18. The oscillator circuit of claim 11, wherein successive turns of the primary spiral occupy the same layer of the semiconductor chip, but are radially displaced from prior turns of the primary spiral.

19. The oscillator circuit of claim 11, wherein the controllable current source is configured to provide an alternating current at a frequency greater than one gigahertz with a controllable amplitude.

20. The oscillator circuit of claim 11, wherein the controllable current source is configured to provide a direct current.

21. The oscillator circuit of claim 11,
wherein the controllable current source includes a control input for receiving a control voltage, and
wherein the control current produced by the controllable current source is proportionate to the control voltage.

22. An apparatus for providing a variable inductance within a semiconductor chip, comprising:
a primary spiral composed of a conductive material embedded within the semiconductor chip to provide a source of variable inductance;
a control spiral composed of the conductive material vertically displaced from the primary spiral in neighboring layers of the semiconductor chip;
wherein the control spiral is magnetically coupled with the primary spiral so that changing a control current through the control spiral induces a change in inductance through the primary spiral;
a controllable current source coupled to the control spiral that is configured to provide the control current;
wherein the controllable current source includes a control input for receiving a control voltage, and
wherein the control current produced by the controllable current source is proportionate to the control voltage; and
a core surrounding the primary spiral and the control spiral in the semiconductor chip;
wherein the core is comprised of a core material with a magnetic permeability that facilitates magnetically coupling the control spiral with the primary spiral;
wherein the core material includes NiZn.

23. The apparatus of claim 22,
wherein the primary spiral includes a plurality of spirals composed of the conductive material that are vertically displaced from each other on different layers of the semiconductor chip, and
wherein the plurality of spirals are linked together through vertical conductors between the different layers of the semiconductor chip.

24. The apparatus of claim 22, wherein the primary spiral is in the form of a helix, wherein successive turns of the helix are vertically displaced from each other in different layers of the semiconductor chip.

25. The apparatus of claim 22, wherein successive turns of the primary spiral occupy the same layer of the semiconductor chip, but are radially displaced from prior turns of the primary spiral.

* * * * *